United States Patent [19]

Beard

[11] 4,169,219

[45] Sep. 25, 1979

[54] COMPANDER NOISE REDUCTION METHOD AND APPARATUS

[76] Inventor: Terry D. Beard, 619 Hampshire Rd., Westlake Village, Calif. 91361

[21] Appl. No.: 782,846

[22] Filed: Mar. 30, 1977

[51] Int. Cl.² .......................... G11B 7/00; H04B 1/64
[52] U.S. Cl. .............................. 179/100.3 R; 360/67; 360/27; 179/100.3 D; 179/15 AV; 333/14; 325/62
[58] Field of Search ................ 179/100.3 N, 100.3 T, 179/100.3 M, 100.3 GN, 100.3 D, 100.3 B, 100.3 R, 100.1 R, 100.1 TD, 100.4 C, 15 AV; 360/67, 68, 25, 26, 27, 28, 24, 7; 325/62; 333/14, 17 L; 328/169

[56] References Cited

U.S. PATENT DOCUMENTS

| | | | |
|---|---|---|---|
| 2,221,681 | 11/1940 | Schlegel | 179/100.3 M |
| 3,379,839 | 4/1969 | Bennett | 360/67 |
| 3,518,578 | 6/1970 | Oppenheim | 333/14 |
| 3,619,511 | 11/1971 | Ishikawa | 179/15 AV |
| 3,631,365 | 12/1971 | Dolby | 333/14 |
| 3,769,611 | 10/1973 | Scaggs | 333/14 |
| 3,879,674 | 4/1975 | Dragon | 360/67 |
| 3,885,111 | 5/1975 | Ishigami | 333/14 |

Primary Examiner—Bernard Konick
Assistant Examiner—Alan Faber
Attorney, Agent, or Firm—Poms, Smith, Lande & Rose

[57] ABSTRACT

An information signal is compressively encoded for application to a limited amplitude transmission channel, such as a cinemagraphic film, by generating a gain control signal which represents the information signal level, delaying the information signal until the gain control signal has been substantially generated, and using the gain control signal to control encoding of the delayed information signal. The encoded information signal may be transmitted by itself with a similar delay step employed to decode it after reception, or the gain control signal may be transmitted along with the information signal and employed in the decoding operation, thereby avoiding the need for a delay step in the decoding process. In the latter case the gain control signal may be encoded along with the information signal, and employed in a feedback control loop for the encoding process.

The invention also includes apparatus designed to perform the disclosed method.

18 Claims, 14 Drawing Figures

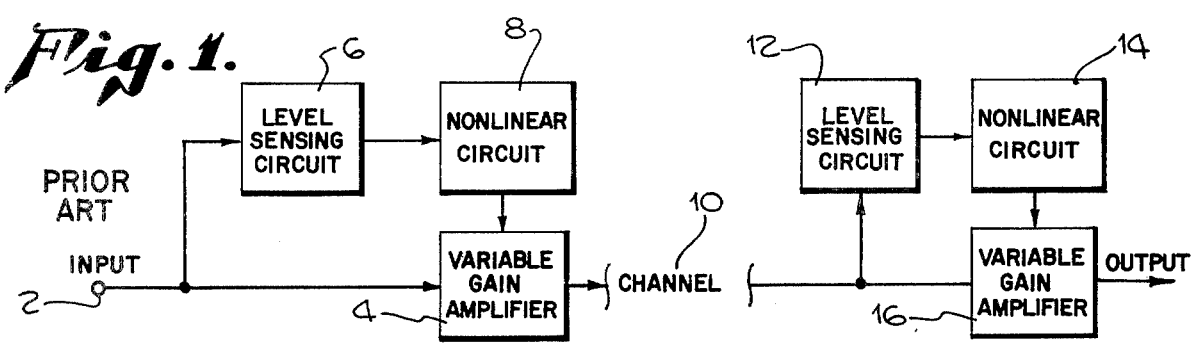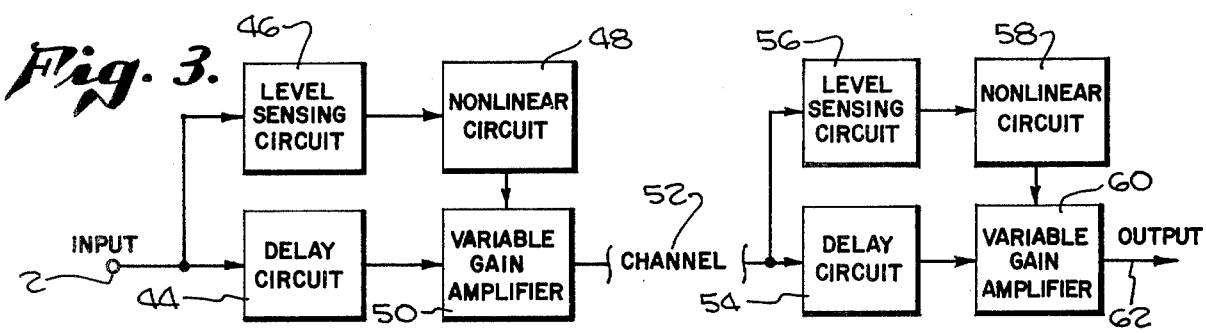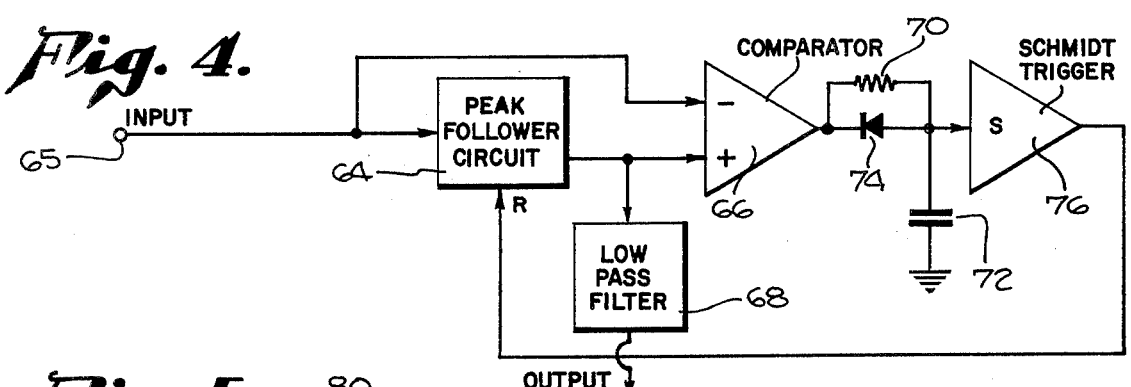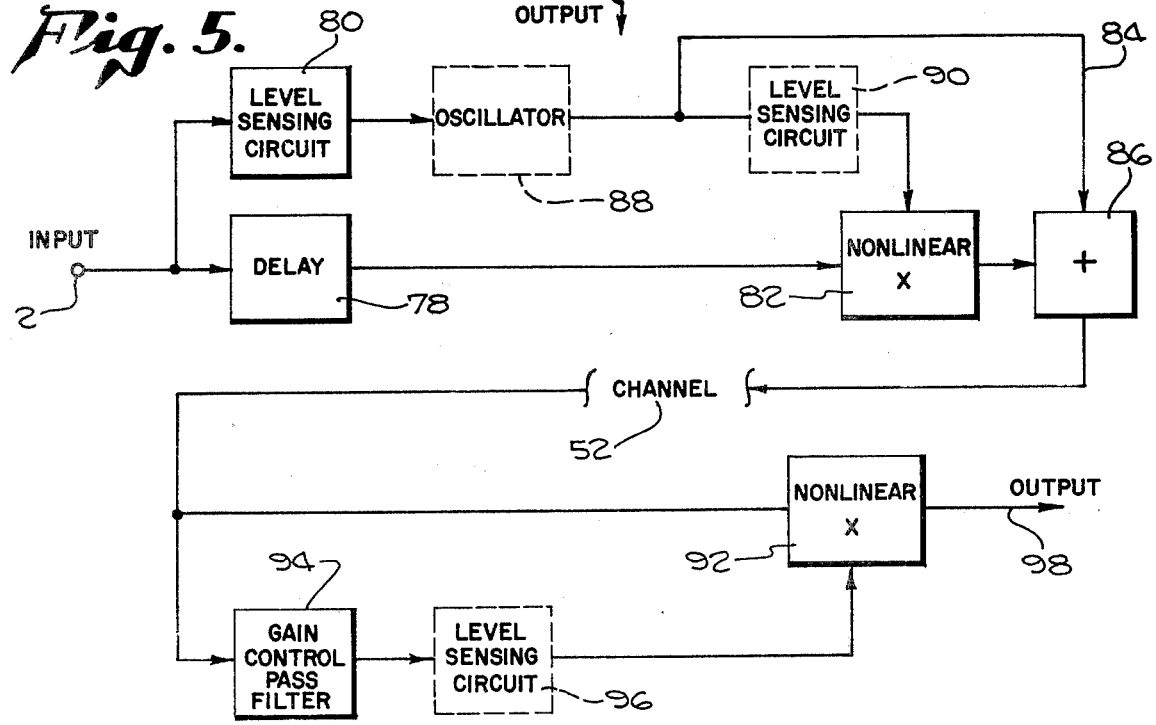

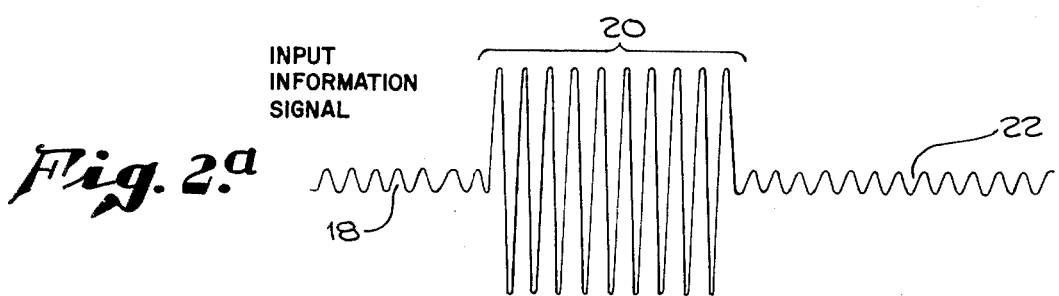
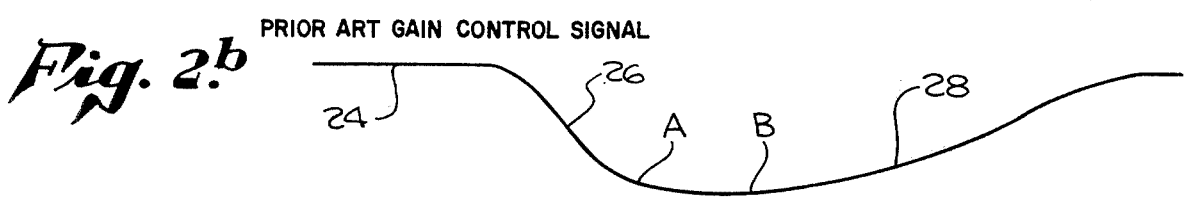
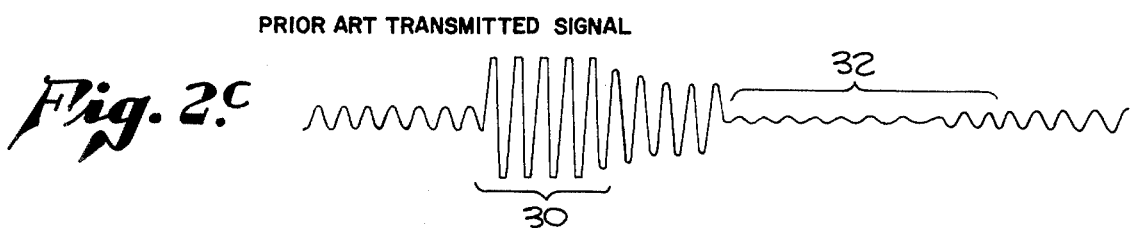
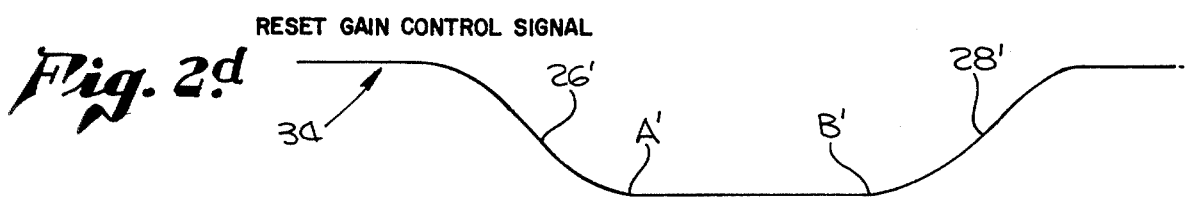
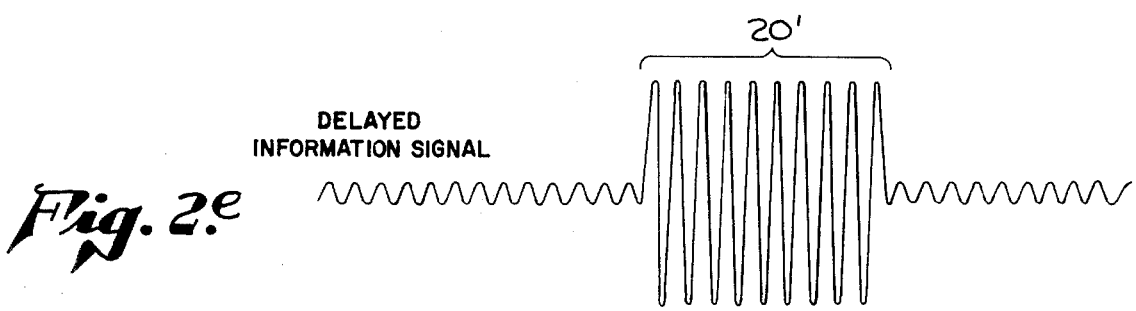
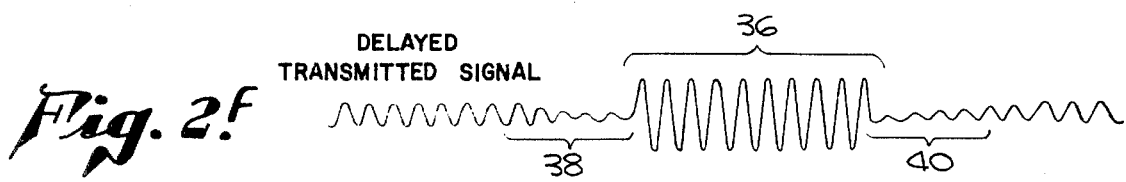

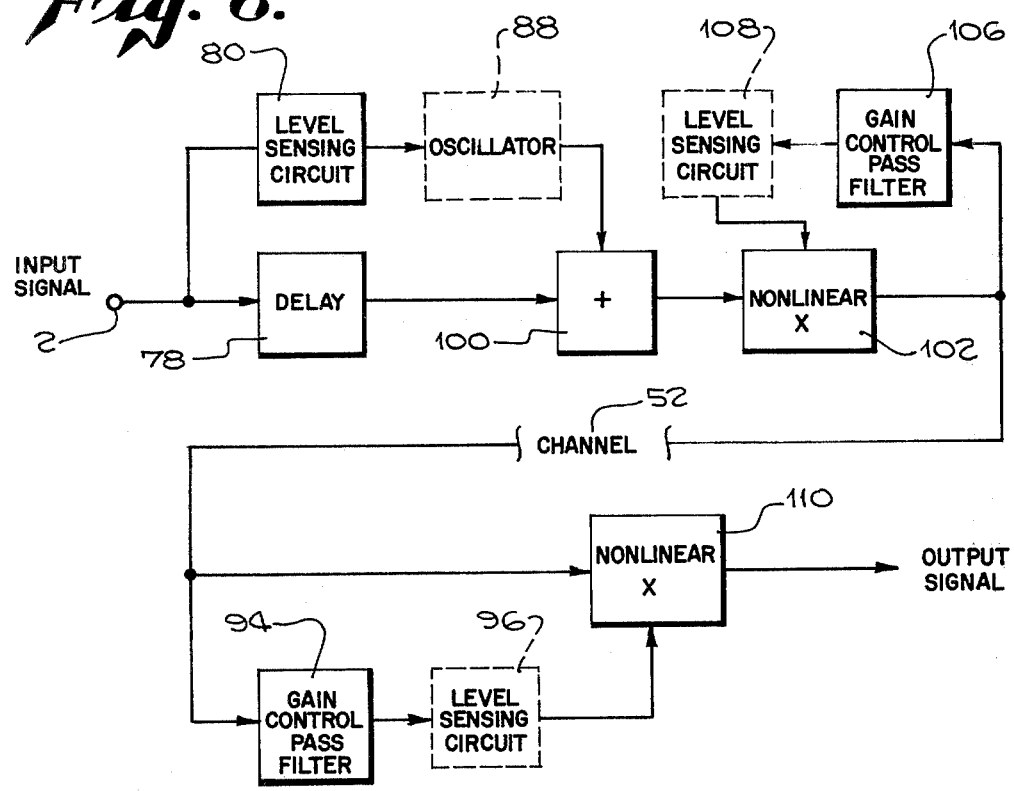
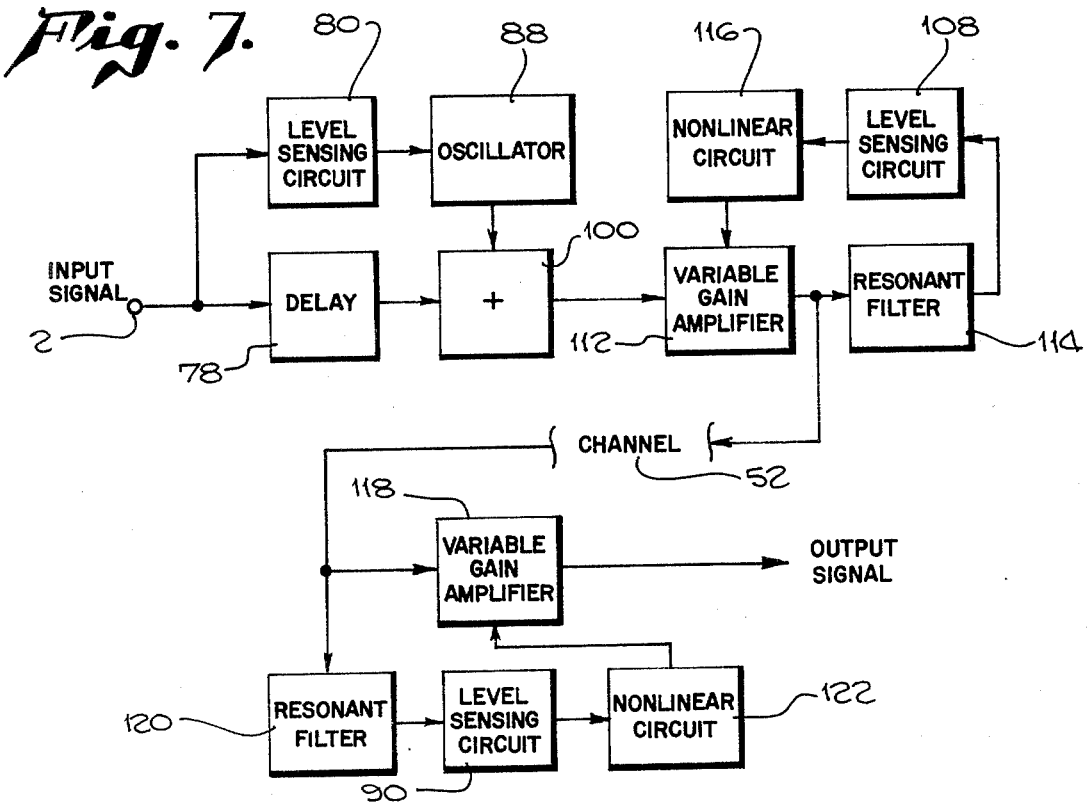

COMPANDER NOISE REDUCTION METHOD AND APPARATUS

BACKGROUND

1. Field of the Invention

This invention relates to a method and electrical circuitry for low noise transmission of electrical signals, and more particularly to a compander signal transmission method and circuitry therefore.

The subject matter of the present invention was disclosed in Disclosure Document entitled "Noise Reduction System for Optical Motion Picture Soundtracks", No. 050581, filed July 2nd, 1976.

2. Description of the Prior Art

Compander transmission is used to transmit information signals having relatively large variances in signal level over a limited amplitude transmission channel which is incapable of accurately handling the full amplitude range of the information signal. According to this method, the signal is compressively encoded for transmission so that the relative gain of its higher level portions is reduced with respect to its lower level portions, whereby the signal after encoding occupies a reduced amplitude range. At the receiving end the transmitted signal is decoded by increasing the relative gain of the higher level signals in a fashion complementary to the encoding process.

The first systems of this type were employed to improve the signal-to-noise quality of telephone communications One form of compander used in telephone systems and more recently in other audio systems is the syllabic compander. In this type of compander, illustrated in FIG. 1, the signal envelope level is used to control the signal gain in transmission and playback. An information signal at input terminal 2 is transmitted to a variable gain amplifier 4, and also to a level sensing circuit 6 which senses the amplitude of the signal envelope. The output of the level sensing circuit is conditioned by a non-linear circuit 8, which controls the gain of amplifier 4 so as to amplify lower level signals more than higher level signals. The encoded output of amplifier 4 is transmitted over a transmission channel 10 to a decoding section comprising a level sensing circuit 12, non-linear circuit 14, and variable gain amplifier 16 connected similarly to the encoding section. The decoder non-linear circuit 14 is complementary to encoder non-linear circuit 8, causing decoder amplifier 16 to expand the transmitted signal and thereby reproduce the original information signal at its output.

A significant problem encountered with the compander circuit described thus far is that the transient response time of the level sensing circuits must be slow so as to restrict the bandwidth of the gain control signal compared to that of the encoded signal. This slow transient response time manifests itself as a degradation of the total system transient response, which phenomenon is illustrated in FIGS. 2a-2c. FIG. 2a illustrates an input information signal characterized by an initial low level or quiescent state 18, followed by a high level signal burst 20, and finally a return to a low level state 22. FIG. 2b illustrates a typical level sensing response to such an input signal. The gain control signal produced by the level sensing circuit is relatively high during the initial period 24. The transient response of the gain control signal at the appearance of the large amplitude signal burst 20 is indicated by the sloped portion 26 of the curve. As can be seen, the signal does not reach its minimal level until point A, which depending on the type of level sensing used might typically occur about five milliseconds after the information signal burst is first detected. The gain control signal remains at the reduced level until point B, corresponding to the end of the information signal burst, after which it gradually increases over another transient response period, indicated by sloped portion 28, back to the original quiescent level.

The transmitted signal, illustrated in FIG. 2c, is obtained by multiplying the information and gain control signals together. During the transient response period 26, however, the gain control multiplier has not yet reached its final minimum level and is too high for the corresponding information signal. The resulting transmitted signal level is also too high during this period and, if it exceeds the dynamic range of the transmission channel, the peaks of the transmitted signal which fall outside that range will be chopped away. This situation is illustrated by the chopped signal 30 in FIG. 2c. At the receiving end of the system the transient is further distorted because the level sensing circuit at that end can increase the gain of its variable gain amplifier only slowly, resulting in a transient output that is further reduced in level. The ultimate result is that the transient portion of the restored signal after transmission is not only attenuated but also distorted. The more severe the compression used in the compander system, the more severe is the attenuation and distortion of transients. Further, the effectiveness of the compander in reducing noise is mitigated by the relatively slow decay of the gain control signal at 28. The result is that in decoding, the gain is maintained relatively high for a considerable time after the end of the transient burst, making channel noise more objectionable.

The distortion problem has been particularly annoying in past attempts to optically record multiple audio tracks on cinemagraphic film. The same film area is generally allocated to audio regardless of how many tracks are used. This area must be divided up between each of the audio tracks, with a further portion allocated to dead space separating the tracks. While the film area is generally adequate for single track recordings, attempts to simultaneously record all four tracks of a quadraphonic system have been characterized by recorded signals which frequently exceed the dimensional limits of their respective tracks. While this problem might be attacked by increasing the compression of the encoded signals to reduce their amplitude range, such an approach also increases signal noise due to the reduced dimensions of the recorded signal relative to film graininess, dirt, and dust.

SUMMARY OF THE INVENTION

In view of the above problems associated with the prior art, the primary objective of the present invention is the provision of a novel and improved compander method and apparatus for low noise and low distortion signal transmission.

Another object is the provision of a novel and improved compander method and apparatus which avoids distortion due to slow gain control transient response and resultant channel overload.

Another object is the provision of a novel and improved signal encoding method and apparatus for compressively encoding an information signal first to obtain a substantially constant relationship between the amplitude of the burst and the corresponding encoded signal over substantially the entire duration of the burst.

Still another object is the provision of a novel and improved compander method and apparatus whereby a gain control signal is generated for transmission along with an encoded information signal to control decoding of the information signal.

Still another object is the provision of a novel and improved method and apparatus for optically recording multiple audio tracks on film.

These and other objects are accomplished in the present invention by a method which comprises sensing the level of an input information signal, generating a gain control signal which represents that level, delaying the information signal until the gain control signal has been substantially generated, encoding the delayed information signal, and controlling that encoding with the gain control signal such that the level of the encoded signal is compressed with respect to the original information signal level. The encoded signal may be decoded after transmission by a complementary delay and decoding operation, or the necessity of a delay at the receiving end may be eliminated by transmitting the gain control signal along with the encoded information signal. In the latter situation the gain control signal is itself preferably also encoded, and employed in a feedback loop to control the encoding process. The gain control signal is preferably shifted in frequency from the information signal to facilitate its isolation for use at the receiving end and also in the feedback loop.

According to another feature, generation of the gain control signal is reset at a time which lags termination of the information signal by a period substantially equal to its delay period. The system can thereby retain the reduced gain as long as required, and achieve rapid transient return to the high level to maintain maximum rejection of channel noise.

In a preferred embodiment of the invention, audio signals are recorded on a film medium by generating a gain control signal the amplitude of which represents the peak amplitude envelope of the audio signal, delaying the audio signal until the gain control signal has been substantially generated, forming a composite signal by adding the audio and gain control signals, and amplifying the composite signal to encode it. The amplification gain is controlled with the gain control signal to compress the amplified composite signal, which is then optically recorded on a film medium. The gain control portion of the composite signal, which is preferably below the audio range, is isolated after amplification and used to control the gain of the amplified composite signal in the negative feedback loop of the output gain control amplifier. In playback the gain control portion of the composite signal is isolated and used to control the amplification of the signal, thus recovering the proper signal level.

DESCRIPTION OF THE DRAWINGS

Further advantages and features of the invention will be apparent to those skilled in the art from the ensuing detailed description thereof, taken together with the accompanying drawings, in which:

FIG. 1 is a block diagram of a prior art compander system;

FIGS. 2a-2c are representative illustrations of the signal level at various points of the prior art system shown in FIG. 1;

FIGS. 2d-2f are illustrations of the signal level, corresponding to FIGS. 2a-2c, at various points of the system contemplated by the present invention;

FIG. 3 is a block diagram of one embodiment of the invention in which an information signal is delayed at both the encoding and decoding ends of the system;

FIG. 4 is a circuit diagram partially in block diagram form of a level sensing circuit that may be employed with the invention;

FIGS. 5 and 6 are somewhat generalized block circuit diagrams of compander systems according to the present invention in which a gain control signal is transmitted along with the information signal, thereby eliminating the need for a delay circuit in the decoding section;

FIGS. 7 and 8 are circuit block diagrams showing the system of FIG. 6 with greater particularity, respectively employing A.C. and D.C. gain control signals in an encoding feedback loop.

DETAILED DESCRIPTION

Figure 8:
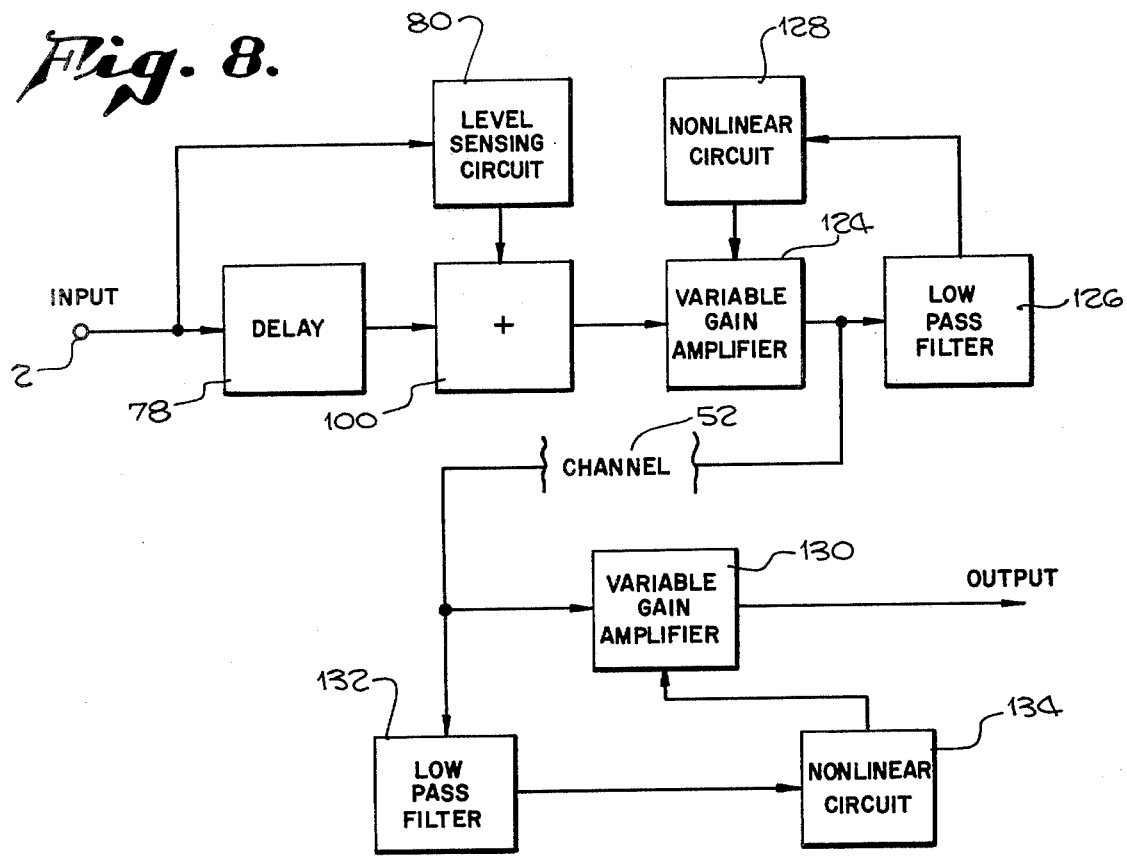

A typical prior art compander system and the noise/distortion problems associated therewith have already been described in conjunction with FIGS. 1 and 2a-2c. Reference will now be had to FIGS. 2d-2f to describe the method contemplated by the present invention, followed by a description of specific systems which may be employed to achieve the method. In the drawings FIGS. 2d-2f are vertically aligned with FIGS. 2a-2c, and are intended to be viewed in conjunction with the latter figures.

Referring first to FIG. 2d, in the preferred embodiment a gain control signal 34, having a decay response characteristic similar to the prior art gain control signal illustrated in FIG. 2b, is generated in response to an input information signal and reaches a steady state minimum value at A'. However, instead of beginning to increase again at the termination of burst 20, the gain control signal is held at its reduced value and permitted to return to a greater level, corresponding to the diminished information signal amplitude, only after it has dwelled at its reduced level for a period substantially equal to the duration of the information signal pulse 20. At this time, indicated by point B', the gain control signal is reset to its quiescent value along a rise path 28' which is generally symmetrical to its decay path 26'.

Referring now to FIG. 2e, the input information signal is delayed by a period substantially equal to the gain control response time, whereby the delayed signal is not transmitted until a time corresponding to A', when the gain control signal has reached a steady state value appropriate to the information signal burst level 20'. The gain control signal thereafter begins to reset at substantially the same time as information burst 20' terminates.

The encoded signal attained by multiplying the delayed information signal by the gain control signal is shown in FIG. 2f. The encoded signal level is substantially uniform over the entire period 36 during which the delayed information burst is present. The remainder of the encoded signal corresponds to a quiescent information level, except for transient portions 38 and 40 at its trailing and leading edges which correspond to gain control transients 26' and 28'. These transients are generally symmetrical, and are readily compensated for at the receiving end of the system. The transmitted signal shown in FIG. 2f is thus limited in amplitude at all points, and substantially eliminates the problem of signal clipping encountered in the prior art.

Specific circuits for achieving the above signal encoding and integrating the encoding section into a compander system will now be described. Referring first to FIG. 3, an input information signal is received into the system at terminal 2, and is applied simultaneously to a delay circuit 44 and a level sensing circuit 46. Delay circuit 44 may be of any conventional design capable of transmitting the information signal after a predetermined delay period, which period substantially equals the transient response time of level sensing circuit 46. The latter circuit detects the amplitude level of the information signal and produces an output proportional to that level. A non-linear circuit 48 receives the output of level sensing circuit 46 and produces a signal which determines the degree of signal compression prior to transmission. Various level sensing circuits may be used, such as peak level detectors, average level detectors, and root mean square level detectors. The output of delay circuit 44 is connected to the input of a variable gain amplifier 50, which receives a gain control signal from non-linear circuit 48. The information signal is thus amplified by a factor determined by the non-linear circuit, which in turn is dependent upon the information signal level.

The output of the encoding section described above is applied to a transmission channed 52 and transmitted by that channel to a decoding section, where a second delay circuit 54 and a second level sensing circuit 56 receive the transmitted channel signals. Level sensing circuit 56 together with a second non-linear circuit 58 forms an expander control for a second variable gain amplifier 60. This amplifier receives the output of delay circuit 54 and furnishes a system output over lead 62.

In operation, an input information signal applied to the encoding section is delayed in delay circuit 44 before being applied to voltage controlled amplifier 50. The information signal level is also sensed in level sensing circuit 46, the output of which is processed in non-linear circuit 48 and controls the amplifier gain. Since the delay period of delay circuit 44 is chosen to be approximately equal to the transient response time of level sensing circuit 46, by the time the delayed information signal arrives at the amplifier input the amplifier gain has been reduced by non-linear circuit 48 (in response to level sensing circuit 46) to be within the dynamic range of the transmission channel 52.

The encoded information signal is received from channel 52 and applied to delay circuit 54, the delay period of which is chosen to be approximately equal to the transient response time of level sensing circuit 56. During delay of the information signal in delay circuit 54, a level sensing operation is performed in level sensing circuit 56. By the time the delayed signal arrives at the input to amplifier 60, the amplifier gain has been increased by non-linear circuit 58 (in response to level sensing circuit 56) so as to decode the received signal and reproduce the original input information signal at its proper level.

It is evident from the foregoing that the effect of level sensing circuits 46 and 56 on the gains of encoding and decoding variable gain amplifiers 50 and 60 must be complementary. For example, if amplifiers 50 and 60 are provided as either analog multiplying circuits or amplifiers with a gain proportional to the gain control signal voltage, and it is desired to achieve a 2:1 db signal compression, the output of non-linear circuit 48 should be inversely proportional to the square root of its input signal. The output of decoding non-linear circuit 58 will then be simply proportional to its input from level sensing circuit 56.

The operation of non-linear circuits for an exponential compression/expansion may be generalized as follows. If the output of non-linear circuit 48 can be expressed as:

(output$=x^a$,)

where x is the value of the input signal as measured by level sensing circuit 46 and a is a constant, then the output of decoder non-linear circuit 58 as a function of its input y can be expressed as:

(output$=y^b$,)

where b$=-a/1=a$.

The compression factor Q in db for exponential encoding is: Q$=1/1=a$. Other more complex functions may be used to achieve special encoding requirements. However, simple exponential encoding as described above has the advantage of input-output level tracking regardless of channel gain.

A preferred configuration for the level sensing circuits is shown in FIG. 4, although it should be realized that numerous other designs are possible. A peak follower circuit 64 is connected to input terminal 65, and has its output tied to the non-inverting input of a comparator 66 and also to a low pass filter 68. The inverting input of the comparator is connected directly to input terminal 65. A charging circuit comprising resistor 70 and capacitor 72 is connected to the comparator output, with a diode 74 connected between the resistor/capacitor junction and the comparator output to conduct current toward the comparator. A Schmidt trigger circuit 76 receives the capacitor voltage and is connected to reset peak follower circuit 64 when triggered. On the output of the level sensing circuit is provided from filter 68.

During operation, the input information signal is applied to peak follower circuit 64, the output of which tracks the incoming signal peaks and holds the highest value thereof until a reset signal is received. Comparator 66 is biased to be in a low state when its inverting and non-inverting inputs are equal. Should the input information signal drop below the output held by the peak follower circuit, comparator 66 switches to a high state to charge capacitor 72 through resistor 70. The resistance and capacitor values are chosen so that the capacitor is charged to the transition voltage of Schmidt trigger 76 in the desired delay period, for example, 30 milliseconds. The Schmidt trigger turns on when its input exceeds its transition threshhold, thereby resetting the peak follower circuit. The peak follower output begins dropping until it reaches the current value of the information signal, at which time the comparator switches to a low state. Capacitor 72 rapidly discharges through diode 74, causing the Schmidt trigger to terminate the recess signal of the peak follower. The peak follower output passes through low pass filter 68, the response time of which determines the delay which must be added to the system by delay circuit 44.

Referring now to FIG. 5, a circuit is shown which attains the advantages of the present invention by introducing a delay only into the encoding but not the decoding portion of the compander system. Input terminal 2 is connected to delay and level sensing circuits 78 and 80, which are essentially similar to the corresponding circuits of FIG. 3. The delay and level sensing circuit outputs are connected respectively to the input and control terminals of a generalized non-linear multiplier circuit 82, which may comprise a combination of a non-linear circuit and variable gain amplifier as illustrated in FIG. 3. The theory of operation of this compander circuit is a gain control signal is generated and transmitted along with the encoded information signal, and employed in the decoder section in lieu of a delay circuit there. In order to discriminate between the transmitted information and gain control signals, the two signals are mutually shifted in frequency. Since the output of level sensing circuit 80 is centered about D.C, it can be used directly as a gain control signal if the information signal occupies a frequency range significantly above D.C., such as the audio range. In this case the level sensing output can be connected directly over a line 84 and summed with the encoded output of non-linear multiplier 82 in a summing circuit 86 before application to transmission channel 52.

Should the information signal overlap the frequency output of the level sensing circuit, discrimination between the information and gain control signals can be achieved by using the output of level sensing circuit 80 to actuate an oscillator 88 which produces an A.C. gain control signal having a frequency greater than the upper limit of the information signal frequency range. The oscillator output is connected to summing circuit 86 to be added to the encoded information signal, and is also processed through another level sensing circuit 90 to produce a D.C. gain control for non-linear multiplier circuit 82. Since oscillator 88 and level sensing circuit 90 are optional, depending upon the characteristics of the input information signal, they are indicated in dashed lines.

In the decoder section the transmitted signal is delivered to a non-linear multiplier circuit 92 which is complementary to encoder circuit 82, and to a pass filter 94 which isolates the gain control signal for application to the control input of multiplier circuit 92. If the gain control signal has been delivered in A.C. form, a level sensing circuit 96 is provided at the output of filter 94 to convert the gain control signal to a D.C. level suitable for application to multiplier circuit 92. The compander output over line 98 thereby reproduces the original information signal.

Another embodiment of a compander system within the present invention, employing a feedback loop for the encoding variable gain amplifier, is shown in FIG. 6. It is current practice in some prior art systems to achieve encoding compression in a compander by placing the level sensing circuit in the feedback loop of the variable gain amplifier. This arrangement is advantageous in that it ensures better dymanic tracking of the encoder and decoder, and the non-linear circuits used in the encoder and decoder are identical. In the present invention, however, placing the level sensing circuit after the variable gain amplifier defeats the purpose of the delay, that is, to control the amplifier. However, the advantages of both the delay and of incorporating the level sensing circuit into an amplifier feedback loop may be realized in the variation of the invention shown in FIG. 6. This implementation also has the advantage that no delay is required in the decoder. Some of the elements of this circuit are the same as for the circuit in FIG. 5, and for such elements the same reference numerals are employed.

The input information signal at terminal 2 is applied through delay circuit 78, level sensing circuit 80, and if necessary, oscillator 88. The delay and level sensing outputs are added in a summing circuit 100 to produce a composite information and gain control signal which is applied to non-linear multiplier circuit 102. The output of this signal is applied over line 104 to transmission channel 52, and also to a feedback loop which comprises a pass filter 106 adapted to pass the gain control signal but block the information signal and, if an oscillator has been employed to produce a gain control signal, also comprises a level sensing circuit 108. The feedback circuit output is applied to the feedback control of non-linear multiplier 102 to control encoding of the transmitted composite signal. In this case the signal delay of circuit 78 must be equal to the resultant composite control signal transient response time of circuits 80, 88, 106, and 108 combined.

It should be noted that only the information portion, but also the gain control portion of the transmitted signal is compressively encoded. The decoding section is essentially the same as the corresponding section shown in FIG. 5, except the decoding non-linear multiplying circuit 110 has the same output function as the encoding non-linear multiplier circuit 102, rather than being complementary thereto.

FIG. 7 shows the circuit of FIG. 6 with greater particularity, employing an A.C. gain control signal. The composite signal output of summing circuit 100 is connected to the input of variable gain amplifier 112, the output of which is applied in turn to transmission channel 52 and also to a resonant filter 114 tuned to the frequency of oscillator 88. The level sensing output actuates non-linear circuit 116 which is connected as a feedback control to amplifier 112 and, together with the amplifier, comprises a non-linear multiplier circuit.

In the decoder section the received signal is applied to the input of another variable gain amplifier 118, while its gain control portion is isolated by a resonant filter 120 also tuned to the frequency of oscillator 88. The ouput of filter 120 is supplied to level sensing circuit 90 and from there to a non-linear circuit 122, which circuit is identical to non-linear circuit 116 in the encoding section. The output of circuit 122 is applied as a feedback control to amplifier 118.

Referring now to FIG. 8, another compander system is shown which is a more particular embodiment of the system of FIG. 6 designed for use with a D.C. gain control signal. Common elements are again indicated by the same reference numerals used previously. The composite information and gain control signal is encoded in a variable amplifier 124, the output of which is applied to transmission channel 52. The gain control portion of the composite signal is isolated by low pass filter 126 and applied directly to non-linear circuit 128, which provides an amplifier feedback control. Since the gain control signal already has a substantial D.C. component, a level sensing circuit in the feedback loop may be dispensed with. As in FIG. 6, the signal delay introduced by circuit 78 should substantially equal the composite transient response time of the control through circuits 80, 126 and 128 combined.

In the decoder section the encoded composite signal is received and amplified by a variable gain amplifier 130 which expands the signal and substantially reproduces the original input signal. The gain control portion of the transmitted composite signal is isolated by low pass filter 132 and applied to a non-linear circuit 134 which is identical to encoder non-linear circuit 128. The output of circuit 134 is applied to amplifier 130 as a gain control to insure accurate reproduction of the original information signal.

Figure 9:
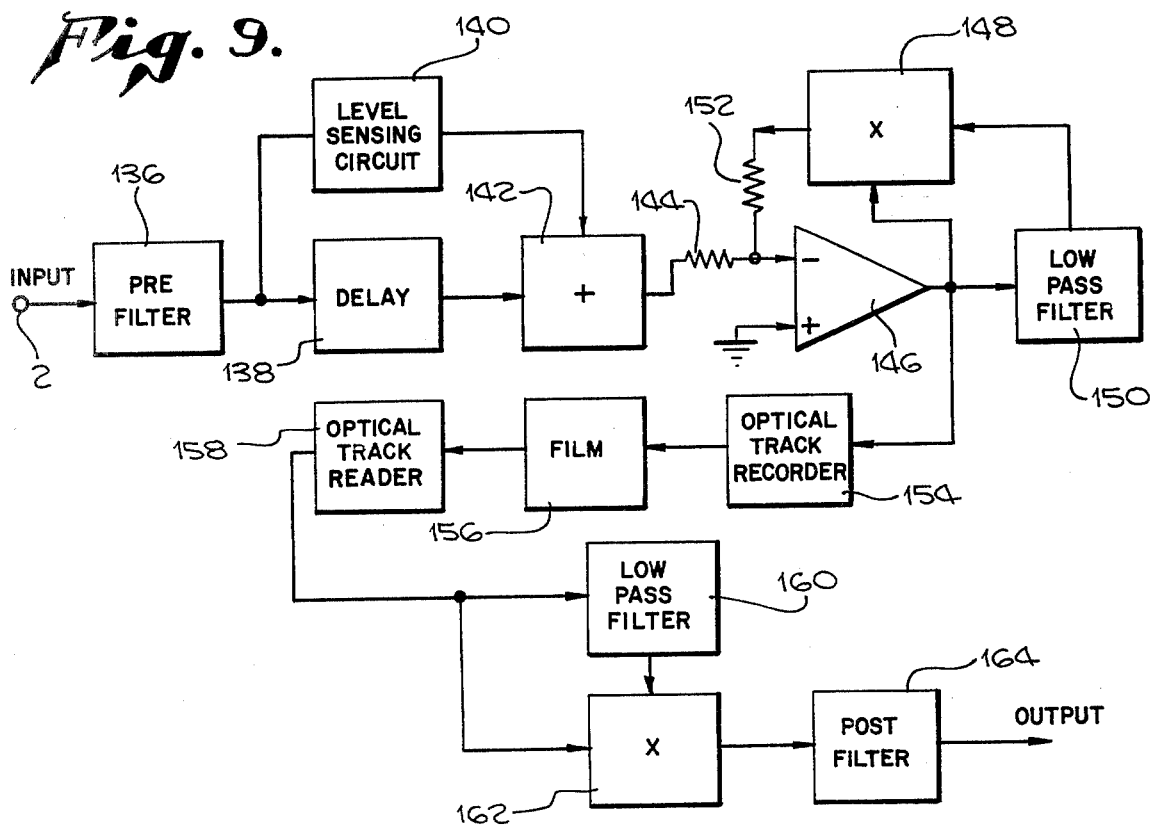
FIG. 9 is a circuit diagram partially in block diagram form showing the compander system of the present invention applied to the optical recording of an audio signal onto film.

A still further embodiment of the invention, shown in FIG. 9, is particularly suited to recording and playing back of optical sound tracks for motion pictures. It is general practice in this area to record a D.C. level on optical motion picture sound tracks as an incidental aspect of a technique for reducing the susceptability of such recordings to foreign matter and or scratches or blemishes on the film. In this known recording process, the signal level at any given time is determined by the light transmittance of the optical track in front of a sensing photodetector. The transmittance of the optical tract is varied in accordance with the signals recorded. Light passed through the developed film then causes the output of a photodetector in the playback unit to reproduce the recorded signal. The transmittance of the photographic optical tract may be varied by changing the density of the track, known in the art as variable density recording, or by changing the clear area of the film, known as variable area recording. A significant source of noise in such recordings is dirt and other foreign matter on the film. To reduce the effect of this source of noise, the transmittance of the film is minimized when either no signal or else a very small signal is present. This noise reduction process if known in the art and is in common practice for making optical sound tracks.

Referring to FIG. 9, the audio signal to be recorded on the optical sound track is first applied to a pre-emphasis filter 136 which increases the amplification of those frequencies above 1500 hertz. The prefiltered signal is then delayed by an analog delay line 138 for approximately 30 milliseconds. Such a delay line may be implemented by charge transfer devices of the so-called "bucket brigade" type integrated circuits. The delay should be selected to pass all frequencies of interest in the signal to be recorded. The undelayed signal is simultaneously applied to a level sensing circuit 140, such as the circuit shown in FIG. 4.

The outputs of delay circuit 138 and level sensing circuit 140 are added by a summing circuit 142. The resulting composite signal is applied thorugh a resistor 144 to the inverting input of an operational amplifier 146, the encoded output of which is in turn furnished to one input of a multiplying circuit 148. The gain control portion of the encoded composite signal is isolated by a low pass filter 150 and transmitted to the other input of multiplying circuit 148. The cut-off frequency of low pass filter 150 is generally chosen to be somewhat greater than that of lowpass filter 68 of the level sensing circuit shown in FIG. 4, for example, 20 hertz. The output of multiplier 148 is connected through a resistor 152 back to the inverting input of amplifier 146, thereby completing a feedback loop. The amplifier output is applied to an optical track recorder 154 to actuate an optical modulator used to record the motion picture optical track, as is well known in the art.

Once a track is recorded on a film 156, it may be read by a conventional optical track reader 158. The output of the optical tract reader is applied simultaneously to low pass filter 160, which is identical to filter 150, and to one input of a multiplier circuit 162. The output of low pass filter 160 is applied to the other input of the multiplier circuit. The multiplied output is processed through de-emphasis filter 164, which operates in a manner complementary to pre-emphasis filter 136.

The above circuit can be used to achieve for example, a nominal 2:1 db signal compression. Greater signal compression may be desirable in certain circumstances, and is accomplished simply by inserting a non-linear function element in the connections between low pass filters 150 and 160 and their respective multiplying circuits 148 and 162. For example, use of a squaring circuit would result in a 3:1 db signal compression.

There has thus been disclosed a noise reduction system which makes use of signal delays to condition an information signal for application to a transmission channel, and which effectively reproduces the original signal after transmission is completed. While particular embodiments of the invention have been shown and described, it should be understood that numerous additional modifications and variations are possible in light of the above teachings. It is therefore intended that the scope of the invention be limited only in and by the terms of the appended claims.

What is claimed is:

1. A compander signal transmission method, comprising the steps of:
   sensing an input information signal level,
   generating a gain control signal which represents said information signal level,
   delaying the information signal until the gain control signal has been substantially generated,
   encoding the delayed information signal together with the gain control signal,
   isolating the gain control portion of the encoded signal,
   applying said isolated signal in a feedback loop to control said encoding to compress the levels of the encoded signals with respect to the original signal levels,
   applying the encoded gain control and information signals to a transmission channel,
   receiving the transmitted encoded gain control and information signals from said channel.
   isolating the received encoded gain control signal, decoding the received information signal, and controlling said decoding with said isolated control signal to expand the transmitted information signal level and substantially recover its original waveform.

2. The method of claim 1, wherein said gain control signal is an A.C. signal, and the encoding and decoding steps includes the steps of actuating substantially identical level sensing circuits with the encoded gain control signal, and applying the outputs of said level sensing circuits to control, encoding and decoding of the information signal, respectively.

3. The method of claim 1, said step of generating a gain control signal including the step of resetting the gain control signal, following a peak in the information signal level, to a level representative of the then current information signal level, said resetting step occurring when there is no intervening information signal peak, at a time which lags said peak by a period substantially equal to the information signal delay period.

4. A method of encoding an information signal for transmission over an amplitude-limited transmission channel, comprising the steps of:
   sensing the information signal level, generating a gain control signal representative thereof, delaying the information signal until the gain control signal has been substantially generated, encoding the delayed information signal together with the gain control signal, isolating the gain control portion of the encoded signal, and controlling said encoding with said isolated signal to compress the level of the encoded signals with respect to the original signal levels.

5. The method of claim 4, said step of generating a gain control signal including the step of resetting the gain control signal, following a peak in the information signal level, to a level representative of the then current information signal level, said resetting step occurring when there is no intervening information signal peak, at a time which lags said peak by a period substantially equal to the information signal delay period.

6. The method of recording an audio signal on a film medium, comprising the steps of:

generating a gain control signal, said gain control signal having an amplitude which represents the amplitude of the audio signal, and a rise time corresponding to a subaudible frequency, delaying the audio signal until the gain control signal has been substantially generated, forming a composite signal by adding together the audio and gain control signals, amplifying the composite signal, controlling the amplification gain with the gain control signal to compress the amplified composite signal level, and optically recording the amplified composite signal on a film medium.

7. The method of claim 6, wherein the amplification control step comprises isolating the gain control portion of the composite signal after amplification, multiplying the amplified composite signal by the isolated gain control portion, and applying said multiplied signal as an amplification feedback control.

8. The method of claim 6, the frequency of said gain control signal being substantially below the audio range.

9. The method of claim 6, and further comprising the step of resetting the gain control signal, following a peak in the information signal level, to a level representative of the then current information signal level, said resetting step occuring when there is no intervening information signal peak, at a time which lags said peak by a period substantially equal to the audio signal delay period.

10. Encoding circuit apparatus for use in a compander system, comprising:

a variable gain amplifier means, the output of which is adapted to be applied to a transmission channel, circuit means adapted to receive an input information signal, and in response thereto to generate a gain control signal which is shifted in frequency from the information signal, said means for generating a gain control signal including a level sensing circuit adapted to produce an output representative of the peak values of the input information signal, said level sensing circuit having a predetermined response time, and further including a delay circuit connected to delay the information signal until the output of the level sensing circuit has been substantially fully generated, means for presenting said delayed information signal and said gain control signal as a composite input signal to said amplifier means, and an amplifier control circuit responsive to the amplified gain control portion of the output of said amplifier means for establishing an amplifier gain to compress the level of said composite signal.

11. The apparatus of claim 10, especially suited for transmission of audio signals, wherein said means for generating a gain control signal includes a level sensing circuit actuable over a predetermined response time and having a gain control output at less than audio frequency, and said amplifier control circuit includes a low pass filter adapted to pass the gain control signal but exclude audio signals.

12. The apparatus of claim 10, said level sensing circuit including a self-actuated reset means adapted to operate a predetermined period of time after a peak in the information signal, and further including means to disable said reset means upon the occurance of an intervening information signal peak.

13. The apparatus of claim 12, the period for said reset means to operate being substantially equal to the response time of said level sensing circuit.

14. The apparatus of claim 12, said level sensing circuit comprising a peak follower circuit connected to receive the information signal and hold successive peaks thereof, a comparator circuit connected to produce an output when the signal held by said peak follower circuit exceeds the information signal, and a timing circuit connected to receive the output of said comparator circuit and to deliver a reset signal to said peak follower circuit when the comparator circuit has operated for said predetermined time period.

15. Circuit means for conditioning an audio signal for optical recording on a film medium, comprising:

(a) an input terminal for an electrical audio signal, (b) a level sensing circuit connected to the input terminal and adapted to produce an output the amplitude of which is representative of the peak values of the audio signal, said circuit being actuable over a predetermined response time, (c) a delay circuit means connected to delay the audio signal by a period substantially equal to the response time of the level sensing circuit, (d) an amplifier means having an input connected to receive the level sensing and delayed audio signals as a composite input, and (e) an amplifier feedback control circuit, comprising (1) a filter means connected to the amplifier output, said filter means being adapted to pass the amplified level sensing signal and block the amplified audio signal, (2) a multiplier circuit connected to multiply together the signal at the amplifier output and the signal passed by the filter means, and (3) means connecting the multiplier circuit output as a feedback control to the amplifier means.

16. The apparatus of claim 15, and further including an optical track recorder means connected to receive the amplifier output signal and optically record said signal on a cinemagraphic film.

17. A compander signal transmission system, comprising:

a gain control circuit connected to receive an input information signal, and to generate a gain control signal which represents the information signal level and is shifted in frequency therefrom, said circuit being actuable over a predetermined response time, a delay circuit connected to receive the input information signal, and to delay said signal by a period substantially equal to the response time of said gain control circuit, an encoding circuit connected to receive the outputs of said gain control and delay circuits, and to encode the gain control signal together with the delayed information signal, said encoding circuit including means responsive to said gain control signal to compressively encode the information signal, means for applying the gain control and encoded information signals to a transmission channel, means for receiving said signals from the transmission channel, and a decoding circuit including means responsive to a received gain control signal to expansively decode a received encoded signal and thereby substantially reproduce the original input information signal.

18. The system of claim 17, said encoding circuit including a feedback loop adapted to present a feedback control signal at the encoder circuit input, said control signal being determined by the encoded gain control signal.

* * * * *